(12) United States Patent
Rathore et al.

(10) Patent No.: US 11,624,210 B2
(45) Date of Patent: Apr. 11, 2023

(54) UTILITY METER ENCLOSURE WITH DUAL POSITION LOCKS

(71) Applicant: Landis+Gyr Innovations, Inc., Alpharetta, GA (US)

(72) Inventors: Bahadur Singh Rathore, Noida (IN); Nikhil Tanwani, Delhi (IN)

(73) Assignee: LANDIS+GYR INNOVATIONS, INC., Alpharetta, GA (US)

( * ) Notice: Subject to any disclaimer, the term of this patent is extended or adjusted under 35 U.S.C. 154(b) by 0 days.

(21) Appl. No.: 17/522,824

(22) Filed: Nov. 9, 2021

(65) Prior Publication Data
US 2022/0065000 A1  Mar. 3, 2022

Related U.S. Application Data

(62) Division of application No. 16/311,726, filed as application No. PCT/US2016/038973 on Jun. 23, 2016, now Pat. No. 11,199,028.

(51) Int. Cl.
| | | |
|---|---|---|
| *F16M 11/00* | (2006.01) | |
| *E05B 65/00* | (2006.01) | |
| *H05K 5/02* | (2006.01) | |

(52) U.S. Cl.
CPC ....... *E05B 65/0089* (2013.01); *H05K 5/0208* (2013.01)

(58) Field of Classification Search
CPC .......................... E05B 65/0089; H05K 5/0208
See application file for complete search history.

(56) References Cited

U.S. PATENT DOCUMENTS

| | | | |
|---|---|---|---|
| 4,749,359 A | 6/1988 | White | |
| 4,872,847 A | 10/1989 | Fennell et al. | |
| 4,986,096 A | 1/1991 | Soehner et al. | |
| 5,870,911 A | 2/1999 | DeWalch | |
| 5,979,691 A | 11/1999 | Von Holdt | |
| 6,133,531 A * | 10/2000 | Hayduke | H02G 3/081 174/67 |
| 6,848,946 B2 | 2/2005 | Vicenza et al. | |
| 10,742,010 B1 * | 8/2020 | Baldwin | H02G 3/088 |
| 11,363,727 B1 * | 6/2022 | Yeom | F16M 11/041 |
| 11,431,159 B2 * | 8/2022 | Oishi | H02G 3/081 |
| 2006/0202489 A1 | 9/2006 | Collingham | |
| 2007/0205012 A1 | 9/2007 | Stachowiak, Jr. | |
| 2009/0195974 A1 | 8/2009 | Rambosek et al. | |
| 2010/0043507 A1 | 2/2010 | Dreisbach et al. | |
| 2010/0064625 A1 | 3/2010 | Charlton et al. | |

(Continued)

OTHER PUBLICATIONS

Australian Application No. 2016410602, First Examination Report dated Dec. 2, 2021, 2 pages.

(Continued)

*Primary Examiner* — Amy J. Sterling
(74) *Attorney, Agent, or Firm* — Kilpatrick Townsend & Stockton LLP

(57) ABSTRACT

A utility meter assembly having a base that is secured to a front cover. The assembly includes a dual locking system having a first locking position and a second locking position. In the first locking position, the front cover is removably secured with the base. In the second locking position, the front cover is permanently secured with the base to prevent separation of the two components unless one or both components are destroyed.

6 Claims, 12 Drawing Sheets

(56) References Cited

U.S. PATENT DOCUMENTS

| | | |
|---|---|---|
| 2012/0268864 A1 | 10/2012 | Borowicz et al. |
| 2016/0110567 A1 | 4/2016 | Rooyakkers et al. |
| 2017/0064842 A1* | 3/2017 | Dernier ................ H05K 5/0013 |
| 2017/0257958 A1 | 9/2017 | Sabbag et al. |
| 2019/0307000 A1 | 10/2019 | Sion |
| 2020/0377242 A1* | 12/2020 | Dinka .................... B65D 71/50 |
| 2021/0044097 A1* | 2/2021 | Peto ....................... H02G 3/088 |
| 2021/0100113 A1 | 4/2021 | Lamprecht |
| 2021/0307184 A1* | 9/2021 | Lee ...................... H05K 5/0221 |

OTHER PUBLICATIONS

U.S. Appl. No. 16/311,726, Notice of Allowance dated Aug. 20, 2021, 9 pages.

Indian Patent Application No. 201817045864, First Examination Report dated Mar. 11, 2021, 6 pages.

International Patent Application No. PCT/US2016/038973, International Search Report and Written Opinion dated Sep. 13, 2016, 9 pages.

\* cited by examiner

UTILITY METER ENCLOSURE WITH DUAL POSITION LOCKS

CROSS-REFERENCE TO RELATED APPLICATIONS

This is a divisional of U.S. patent application Ser. No. 16/311,726 entitled "Utility Meter Enclosure With Dual Position Locks" filed Dec. 20, 2018 (Allowed), which a 371 of International Patent Application No. PCT/US2016/038973 entitled "Utility Meter Enclosure With Dual Position Locks" filed Jun. 23, 2016, each of which is incorporated herein in its entirety by reference.

BACKGROUND

The usage of resources such as gas, electricity and water are typically measured using meters. Utility meter enclosures typically include a front cover secured to a base. To prevent unauthorized access to and/or tampering with the meter, the front cover is secured to the base with a locking mechanism. However, current lock designs pose a risk of inadvertently and prematurely locking the front cover to the base during production. Welding is another option for securing the front cover to the base, but one that increases costs and overhead and can lead to reduced quality and environmental concerns.

SUMMARY

The term embodiment and like terms are intended to refer broadly to all of the subject matter of this disclosure. Statements containing these terms should be understood not to limit the subject matter described herein. This summary is a high-level overview of various aspects of the disclosure and introduces some of the concepts that are further described in the Detailed Description section below. This summary is not intended to identify key or essential features, nor is it intended to be used in isolation.

Disclosed is a utility meter enclosure having dual position locks. Specifically, the enclosure includes a plurality of locks that are each received in one of a plurality of receptacles in a first locking position and a second locking position. When in the first locking position, the front cover of the enclosure is temporarily secured with the base such that the front cover will not inadvertently separate from the base, but can still be adjusted if desired or required during manufacture or assembly. When in the second locking position, the front cover is permanently fixed with the base such that the enclosure cannot be opened without breaking one or both of the front cover and the base. The enclosure is locked in the second locking position at the end of the manufacturing and assembly process, after the need for any adjustments.

BRIEF DESCRIPTION OF THE DRAWINGS

The specification makes reference to the following appended figures, in which use of like reference numerals in different figures is intended to illustrate like or analogous components.

DETAILED DESCRIPTION

Figure 1:
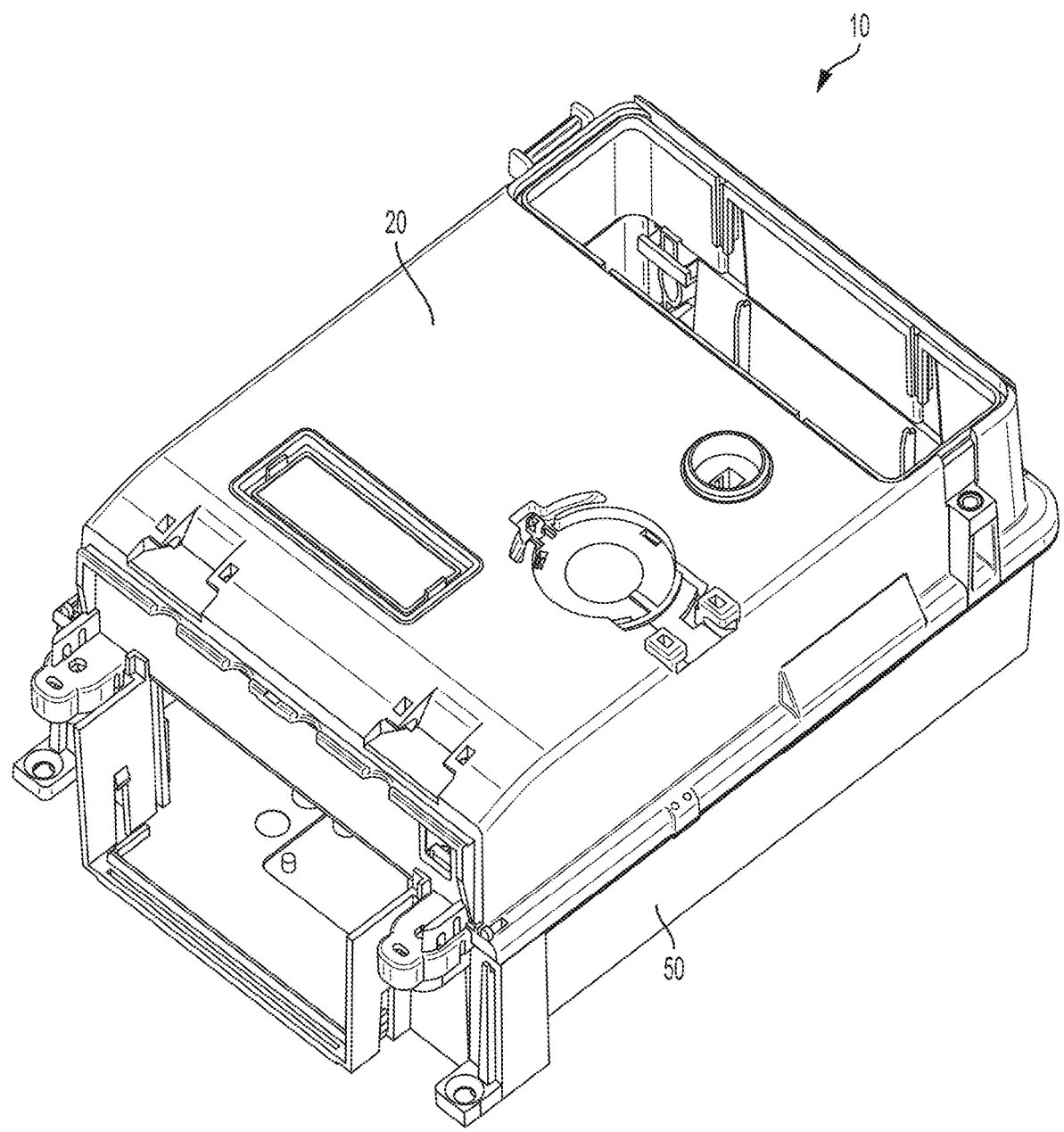
FIG. 1 is a perspective front view of a utility meter enclosure according to an example.
Figure 2:
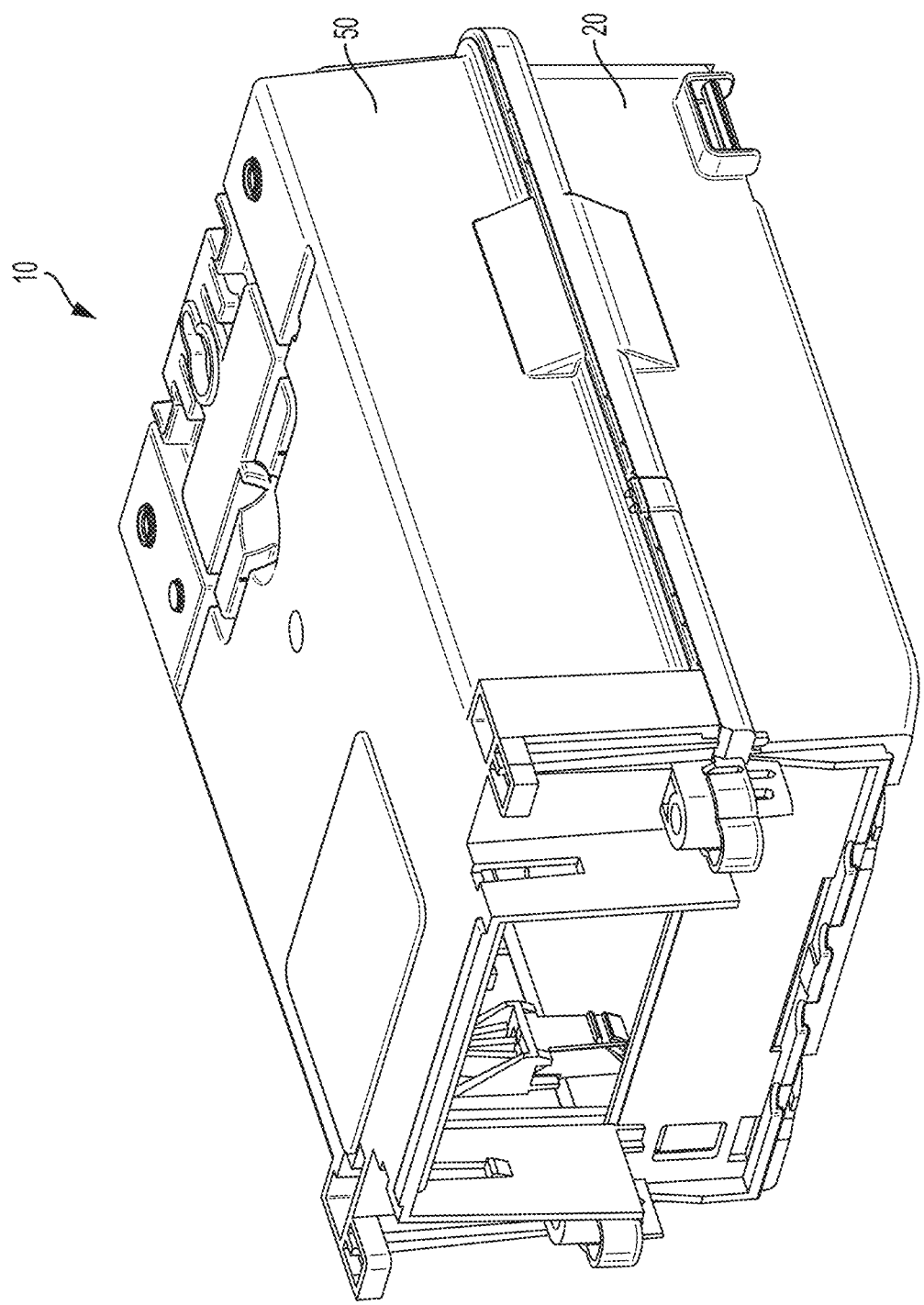
FIG. 2 is a perspective rear view of the utility meter enclosure of FIG. 1.
Figure 3:
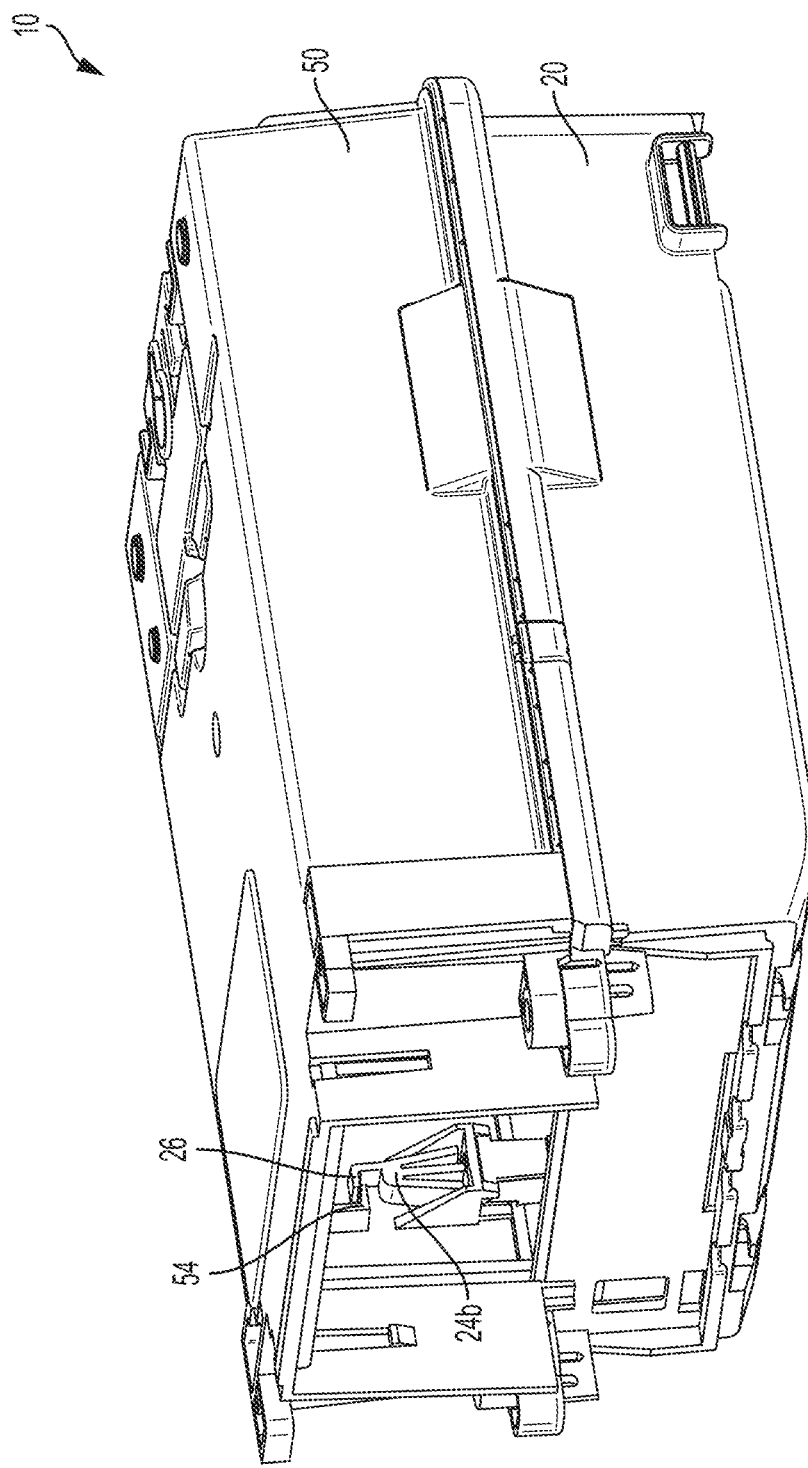
FIG. 3 is another perspective rear view of the utility meter enclosure of FIG. 1.
Figure 4:
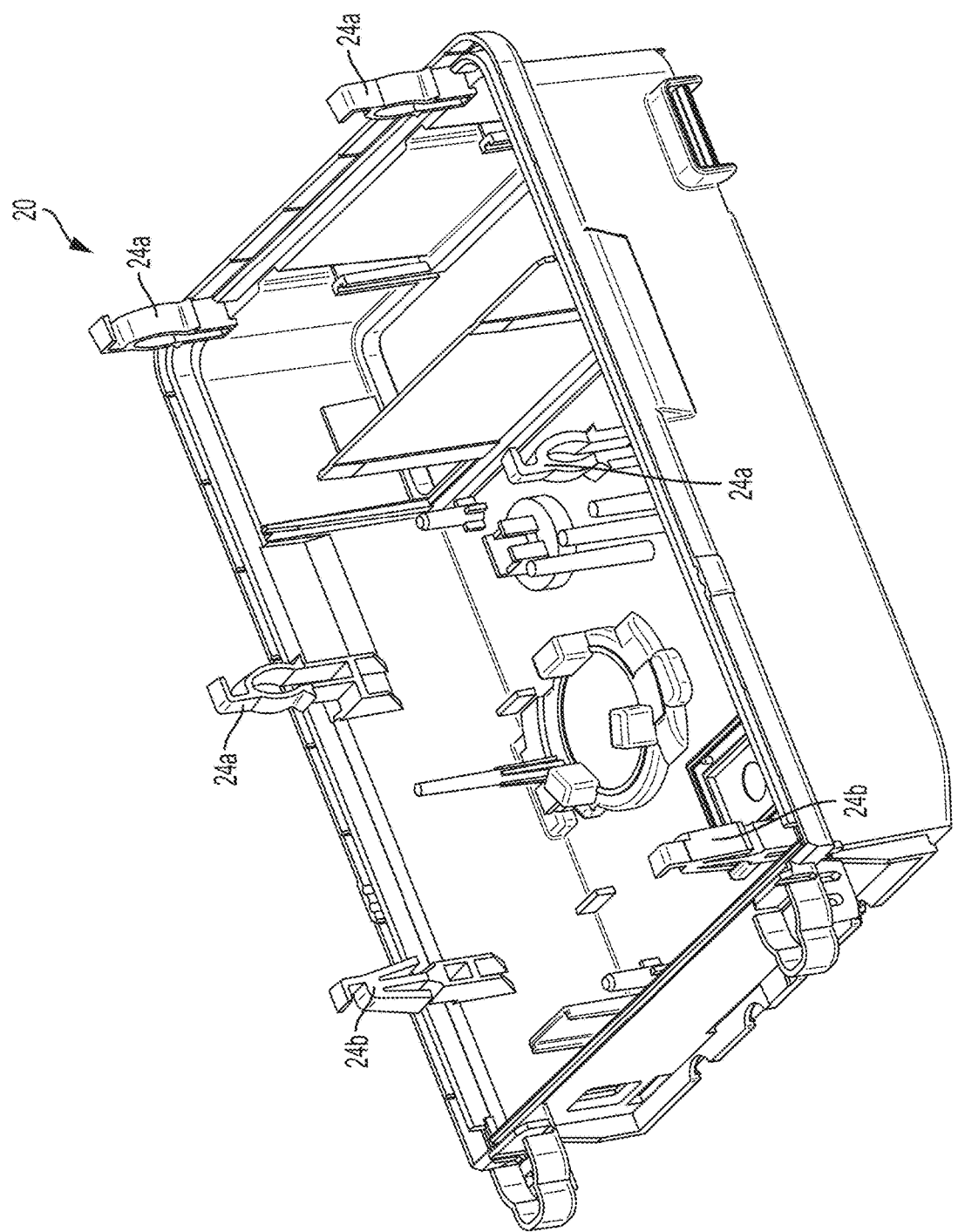
FIG. 4 is a perspective view of the front cover of the utility meter enclosure of FIG. 1.
Figure 5:
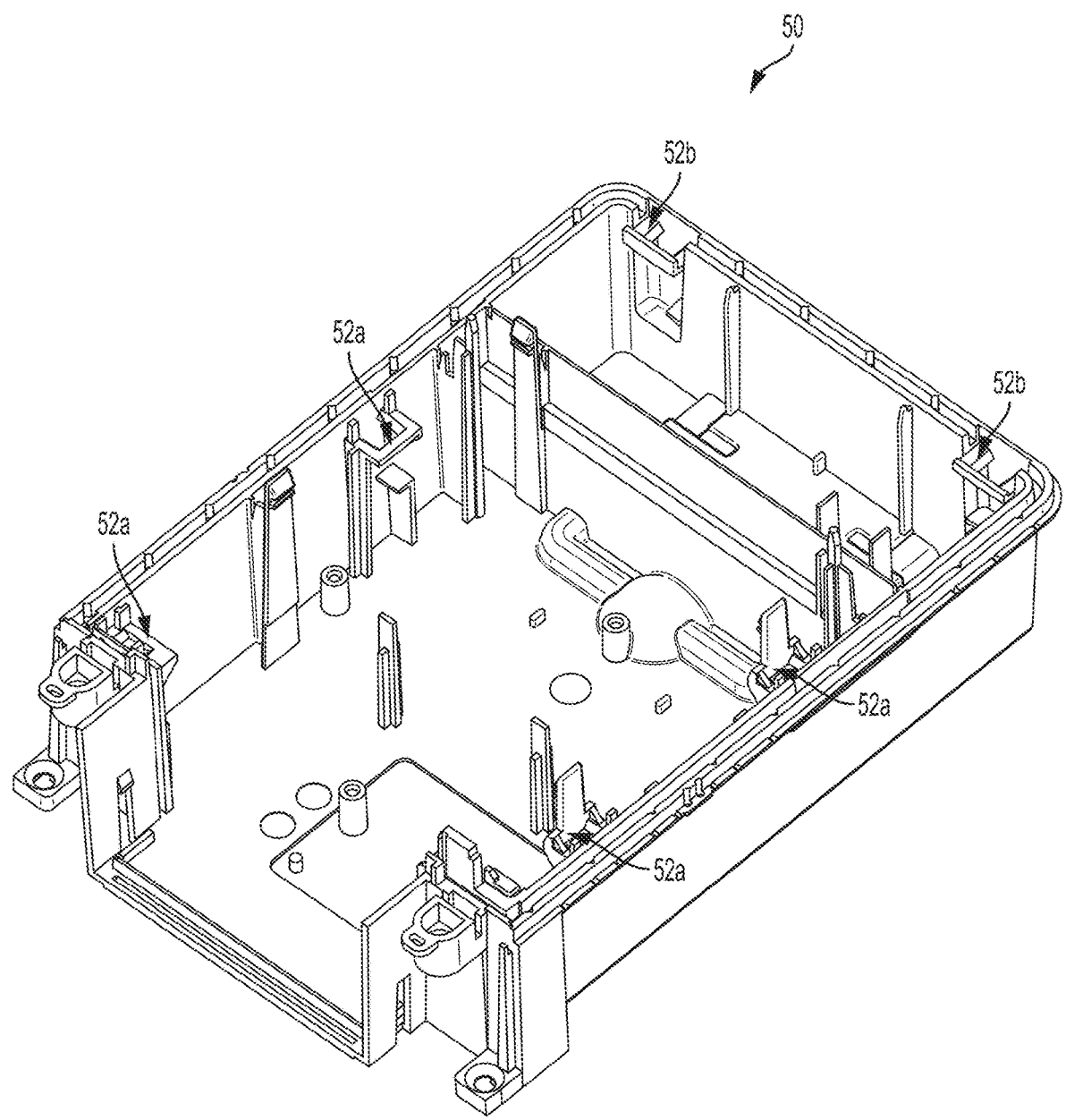
FIG. 5 is a perspective view of the base of the utility meter enclosure of FIG. 1.
Figure 6:
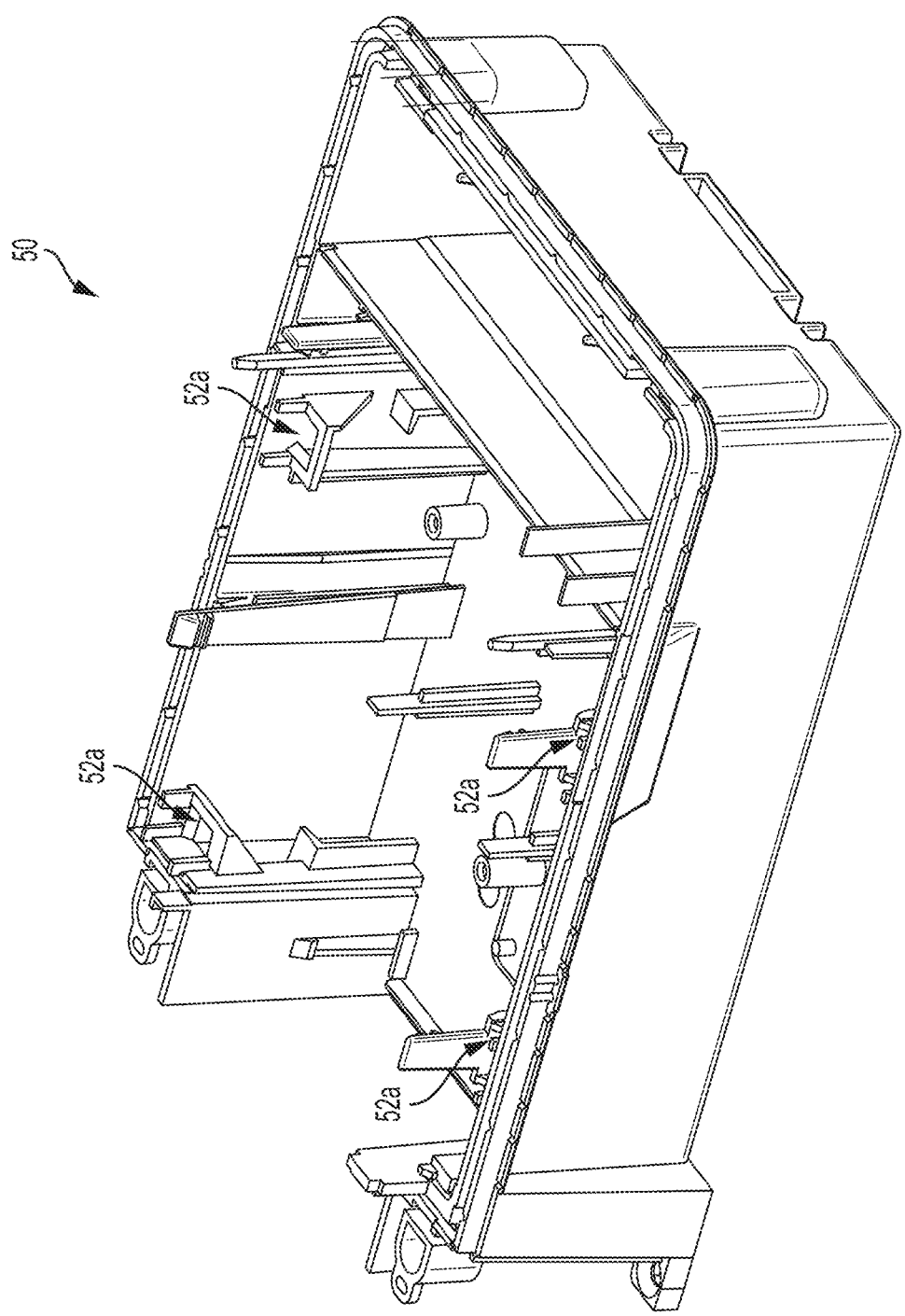
FIG. 6 is another perspective view of the base of the utility meter enclosure of FIG. 1.
Figure 7:
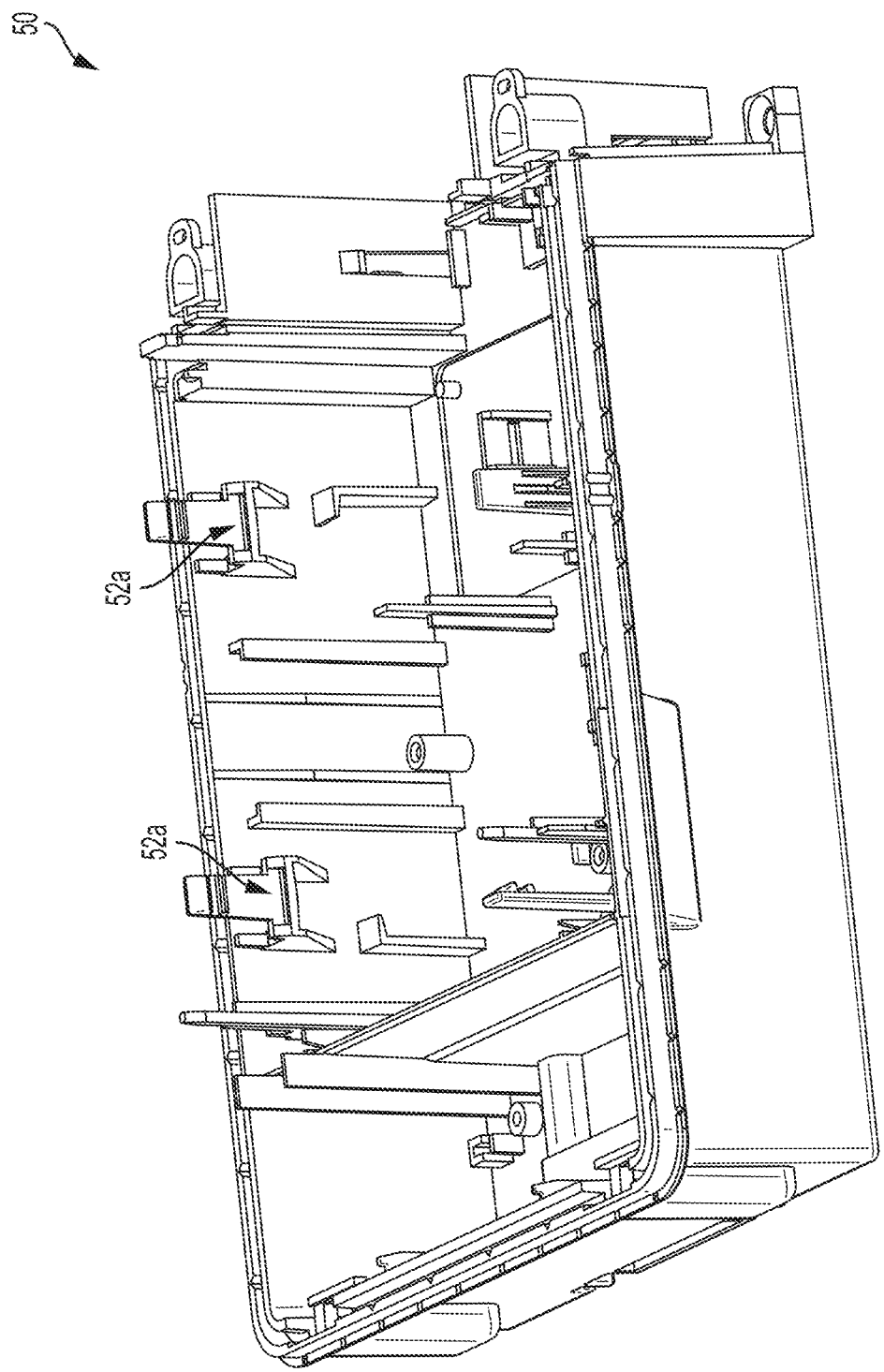
FIG. 7 is another perspective view of the base of the utility meter enclosure of FIG. 1.
Figure 8:
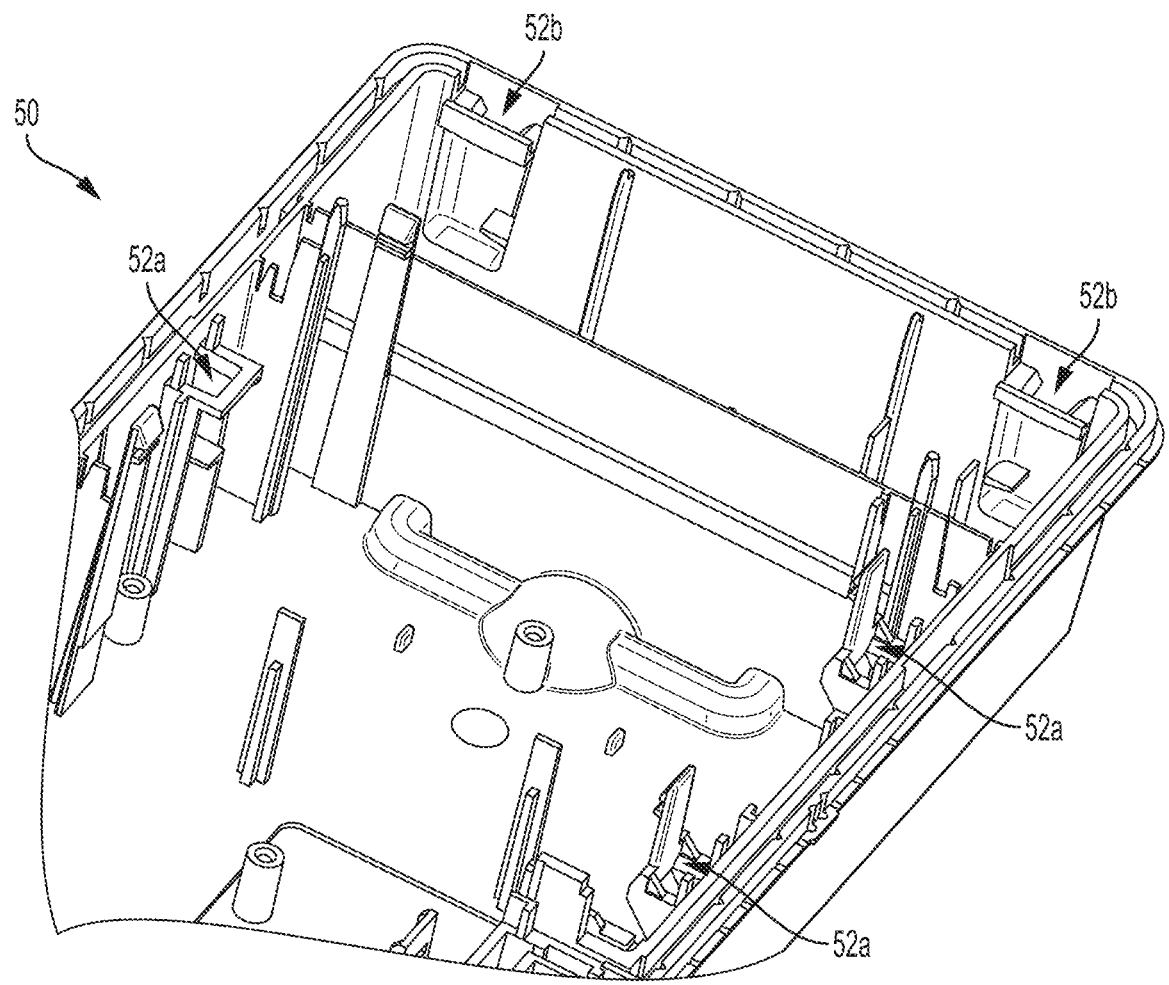
FIG. 8 is another partial perspective view of the base of the utility meter enclosure of FIG. 1.

FIGS. 1-15 illustrate different views of various components of a utility meter enclosure 10. The enclosure 10 includes a front cover 20 (FIGS. 1-4) and a base 50 (FIGS. 1-3 and 5-8) that snap fit or otherwise mate together (see, e.g., FIGS. 1-3).

The enclosure 10 includes a plurality of locks 24a, 24b each configured to be received in one of a plurality of receptacles 52a, 52b. Each lock 24a, 24b has two locking positions, as explained in more detail below. Although the illustrated enclosure includes six locks 24a, 24b and six receptacles 52a, 52b, any suitable number of locks and receptacles may be used.

In the illustrated enclosure, the locks 24a, 24b are positioned around the perimeter of the front cover 20 and the receptacles 52a, 52b are positioned around the perimeter of the base 50. However, the locks 24a, 24b may be positioned on the base 50 and the receptacles 52a, 52b may be positioned on the front cover 20, or any suitable combination thereof.

Similarly, although the illustrated example includes locks having two configurations, 24a, 24b (explained in more detail below), the locks may have alternate configurations. The illustrated enclosure 10 includes four locks 24a and two locks 24b, although any suitable combination may be used, including an arrangement having only locks 24a or only locks 24b or other combinations or locks of other configurations.

Base 50 includes four receptacles 52a and two receptacles 52b (see FIG. 8) that are recessed into an end wall of the base 50. Each of the receptacles 52a, 52b is configured to receive one of the locks 24a, 24b to secure the front cover 20 with the base 50.

Figure 9:
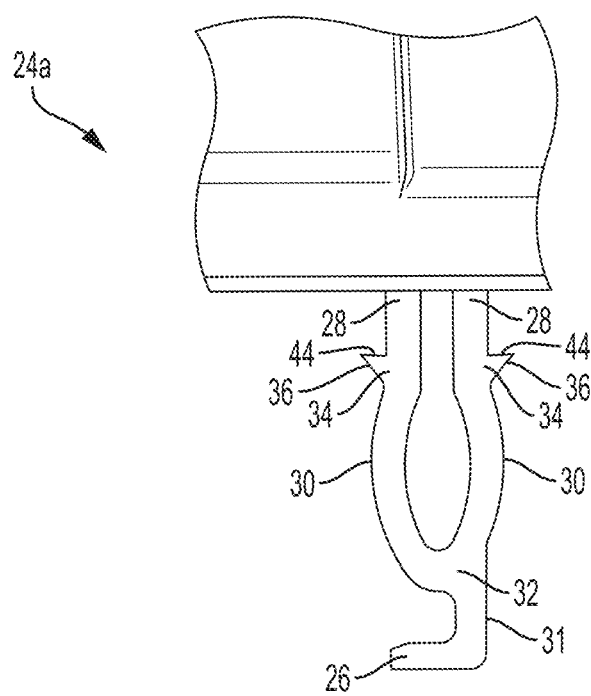
FIG. 9 is a close-up view of one of the locks of the front cover of FIG. 1.

Lock 24a is shown in more detail in FIG. 9. Lock 24a is formed of an elastically deformable material such as plastic. Lock 24a includes two legs 28 that connect at a distal portion 32. Because they are formed of an elastically deformable material, the legs 28 can be compressed toward one another into a compressed position but return to their original position once released. Extending distally from the distal portion 32 is a neck 31 and a resting feature 26, explained in more detail below. Each of legs 28 includes a projection 34 near a proximal end of the lock. Each projection 34 has a planar surface 44 and an angled surface 36. As explained in more detail below, the projections 34 are configured to retain the lock 24*a* in a second locking position. Between the projections 34 and the distal portion 32, the legs each have a curved profile 30. The curved profiles 30 are configured to retain the lock 24*a* in a first locking position.

Figure 10:
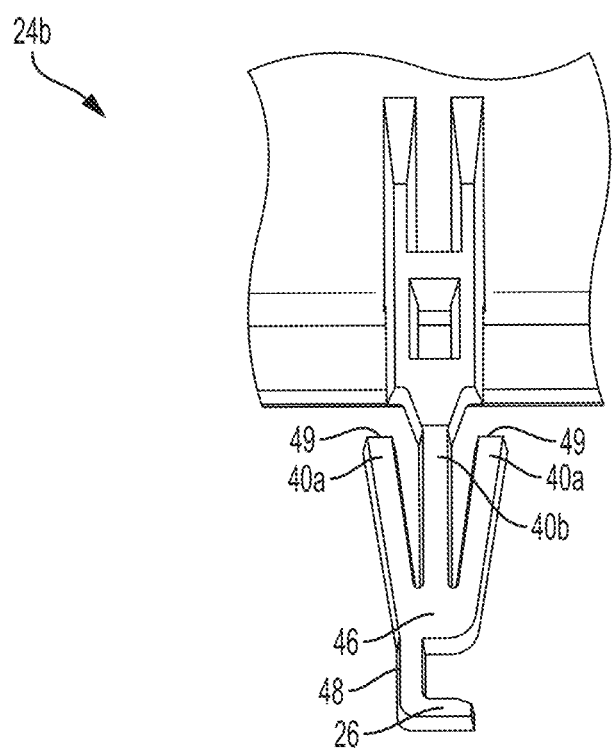
FIG. 10 is a close-up view of another of the locks of the front cover of FIG. 1.
Figure 11:
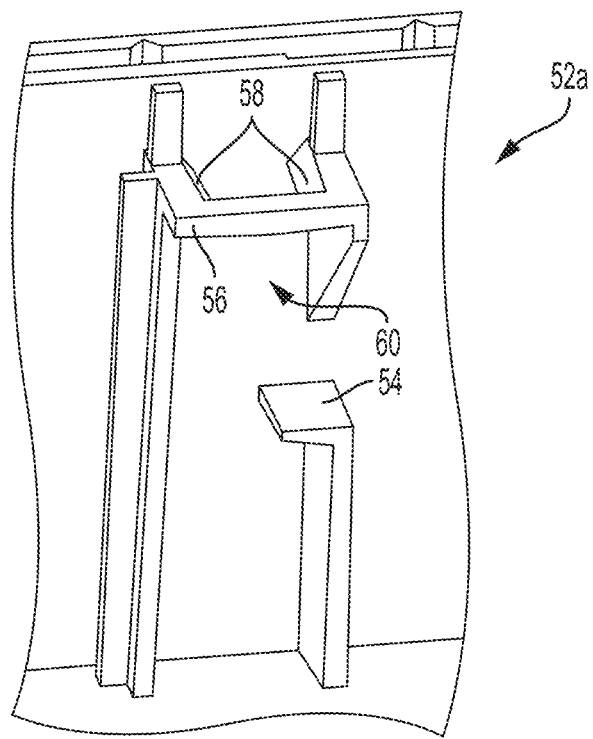
FIG. 11 is a close-up view of one of the receptacles of the base of FIG. 1.

Lock 24*b* is shown in more detail in FIG. 10. Lock 24*b* includes three straight or generally straight legs 40 that join together at a distal portion 46. The two outer legs 40*a* are angled relative to the middle leg 40*b*. Extending distally from the distal portion 46 is a neck 48 and a resting feature 26, explained in more detail below. In some cases, the lock 24*b* is configured so that any attempts to tamper with the enclosure 10 are more evident. In some cases, lock 24*b* is more flexible than lock 24*a* due to the configuration of its legs as compared with the rigidity imparted by the angled surfaces 36 and the curved profiles 30 of the lock 24*a*.

Figure 12:
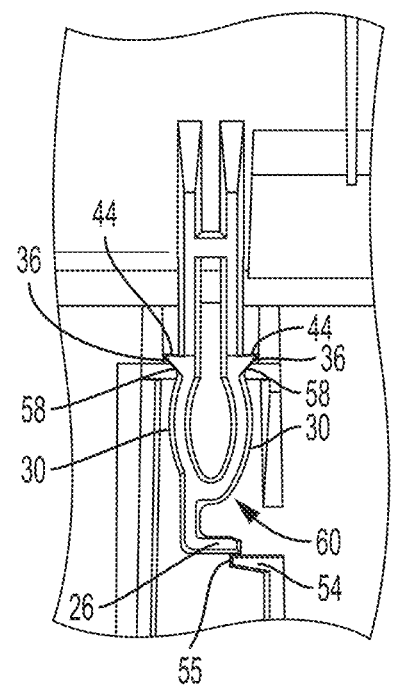
FIG. 12 is a schematic cross sectional view illustrating engagement of the lock of FIG. 9 with the receptacle of FIG. 11 in a first locked position.
Figure 13:
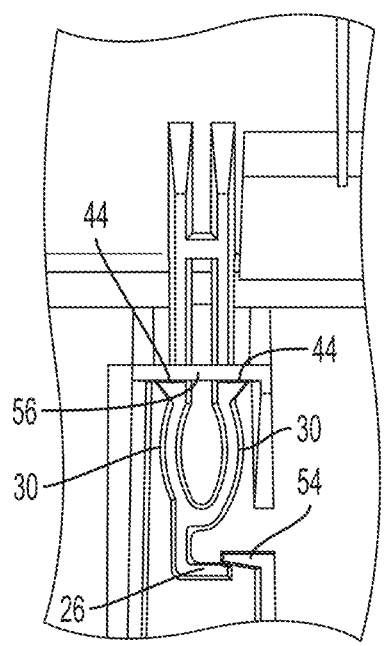
FIG. 13 is a schematic illustrating engagement of the lock of FIG. 9 with the receptacle of FIG. 11 in a second locked position.

As illustrated in FIGS. 12-13, each of the locks 24*a* is configured to be received in one of the receptacles 52*a*, 52*b* in two locking positions. FIG. 12 illustrates the engagement of a lock 24*a* with a receptacle 52*a* in the first locking position while FIG. 13 illustrates the engagement of the lock 24*a* with the receptacle 52*a* in the second locking position. In the first locking position, the front cover 20 is temporarily secured with the base 50, and can be opened if needed. In the second locking position, the front cover 20 is permanently secured with the base 50 and can only be released by breaking the front cover 20 and/or the base 50.

In the first locking position shown in FIG. 12, the lock 24*a* is partially inserted into the open area 60 of the receptacle 52*a*. Specifically, since lock 24*a* is made of an elastically deformable material, the curved profiles 30 of the lock 24*a* are able to compress toward one another to permit the lock 24*a* to pass through the gap between tapered sides 58 of receptacle 52*a*. As illustrated in FIG. 12, the angled surfaces 36 of the projections 34 of the lock 24*a* abut the tapered sides 58 to retain the curved profiles 30 in a partially compressed state. Even in the partially compressed state, as shown in FIG. 12, the width between the curved profiles 30 of the legs 28 is greater than the width of the gap between the tapered sides 58 of the receptacle 52*a*. In this manner, the curved profile 30 of the legs 28 prevents the lock 24*a* from inadvertently backing out of the receptacle 52*a* and helps retain the lock 24*a* in the first locked position.

Moreover, the bottom surface of the resting feature 26 of the lock 24*a* rests along the top surface of the resting ledge 54 of the receptacle 52*a* to prevent the lock 24*a* from inadvertently and prematurely moving into the second locking position. In some cases, the overlap between the resting feature 26 and the resting ledge 54 is configured so that, once the lock 24*a* is in the first locking position, the lock 24*a* only moves to the second locking position upon the application of a sufficient, predetermined force. In some examples, the end point 55 of the resting ledge 54 is positioned between the tapered sides 58 of the receptacle 52*a*. In one non-limiting example, the overlap between the resting feature 26 and the resting ledge 54 is approximately 1 mm. In some cases, the overlap between the resting feature 26 and the resting ledge 54 along with the configuration of the angled surfaces 36 help retain the lock 24*a* in the first locking position.

The lock 24*a* can be released from the first locking position—for instance if the front cover 20 needs to be adjusted during the manufacturing process—by pulling the lock 24*a* away from the open area 60 to separate the resting feature 26 of the lock 24*a* from the resting ledge 54 of the receptacle 52*a*.

Upon the application the predetermined force, the resting feature 26 moves past the resting ledge 54 and the angled surfaces 36 of the projections 34 of the lock 24*a* slide along the tapered sides 58 so the lock 24*a* moves further within the open area 60 of the receptacle 52*a*. This moves the lock 24*a* from the first locking position toward the second locking position. Once the angled surfaces 36 have cleared the tapered sides 58, the projections 34 snap apart as the legs 28 expand back to their original position and the planar surfaces 44 of the projections 34 abut the ledge 56 of the receptacle 52*a*. The abutment of the planar surfaces 44 of the projections 34 with the ledge 56 prevents the lock 24*a* from backing out of the receptacle 52*a*. The lock 24*a* is now in the second locking position and the front cover 20 cannot be separated from the base 50 without breaking one or both of the front cover 20 and the base 50. In the second locking position, the upper surface of the resting feature 26 abuts the lower surface of the resting ledge 54.

Figure 14:
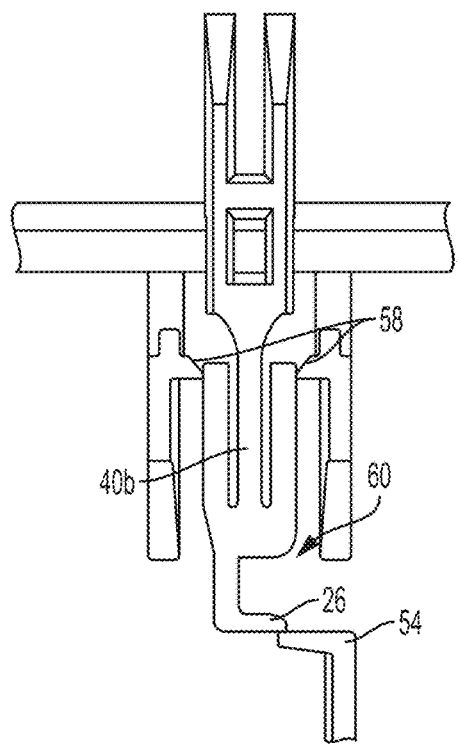
FIG. 14 is a schematic cross sectional view illustrating engagement of the lock of FIG. 10 with the receptacle of FIG. 11 in a first locked position.
Figure 15:
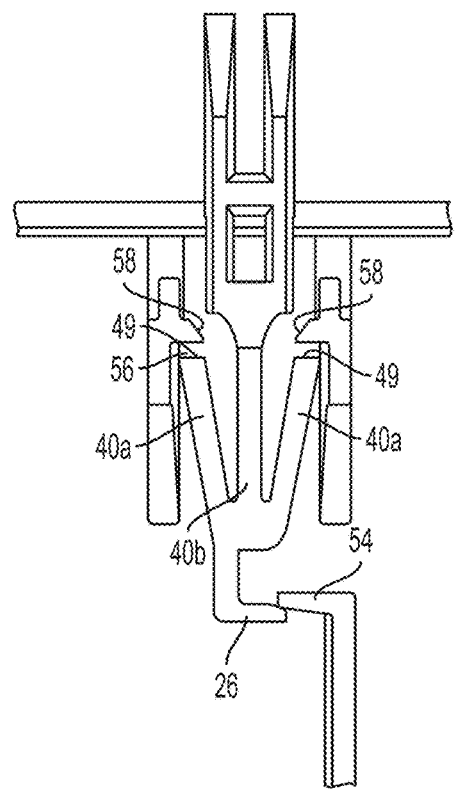
FIG. 15 is a schematic cross sectional view illustrating engagement of the lock of FIG. 10 with the receptacle of FIG. 11 in a second locked position.

As illustrated in FIGS. 14-15, each of the locks 24*b* is also configured to be received in one of the receptacles 52*a*, 52*b*. FIG. 13 illustrates the engagement of a lock 24*b* with a receptacle 52*a* in a first locking position, while FIG. 15 illustrates the engagement of the lock 24*b* with the receptacle 52*a* in the second locking position. In the first locking position shown in FIG. 14, the lock 24*b* is partially inserted into the open area 60 of the receptacle 52*a*. As with the lock 24*a*, the bottom surface of the resting feature 26 of the lock 24*b* rests along the top surface of the resting ledge 54 of the receptacle 52*a* to help prevent the lock 24*a* from inadvertently and prematurely moving into the second locking position. In some cases, the locks 24*a* predominately serve to retain the enclosure 10 in the first locking position, as the configuration of the legs of the lock 24*b* can be such that they do not help prevent the lock 24*b* from inadvertently backing out of the receptacle 52*a*.

Upon the application of the sufficient force, the resting feature 26 moves past the resting ledge 54 so the lock 24*b* moves further within the open area 60 of the receptacle 52*a*. This moves the lock 24*b* from the first locking position toward the second locking position. The abutment of the planar surfaces 49 of the legs 40*a* with the ledge 56 prevents the lock 24*b* from backing out of the receptacle 52*a*. The lock 24*b* is now in the second locking position and the front cover 20 cannot be separated from the base 50 without breaking one or both of the front cover 20 and the base 50. In the second locking position, the upper surface of the resting feature 26 abuts the lower surface of the resting ledge 54.

Numerous modifications of this invention may be made in the composition, application, manufacturing process and other aspects of this invention without departing from the objectives and spirit of the description above and in the Figures.

What is claimed is:

1. A dual position lock for a utility meter enclosure, the dual position lock comprising:
   two elastically deformable legs that are separated from one another at a proximal end and that join together at a distal end, wherein a portion of each of the two legs between the proximal end and the distal end is curved;

two projections, wherein a first of the two projections projects from a first of the two legs and a second of the two projections projects from a second of the two legs and wherein each of the two projections has a planar surface and an angled surface relative to the planar surface; and a resting feature that extends from the distal end, wherein the resting feature is generally parallel to the planar surface of each of the two projections.

2. The dual position lock of claim 1, wherein the dual position lock is one of a plurality of dual position locks projecting from a front cover of the utility meter enclosure.

3. The dual position lock of claim 1, wherein the dual position lock is received within a receptacle of the utility meter enclosure.

4. The dual position lock of claim 3, wherein the two legs are compressed by angled sides of the receptacle to move the dual position lock into a first locking position.

5. The dual position lock of claim 3, wherein the planar surface of each of the two projections abut a bottom surface of a ledge of the receptacle to permanently retain the utility meter enclosure in a second locking position.

6. The dual position lock of claim 4, wherein each of the angled surfaces slides along the angled sides of the receptacle to move the utility meter enclosure from the first locking position into a second, permanent locking position.

* * * * *